United States Patent
Chen et al.

(10) Patent No.: US 6,692,629 B1
(45) Date of Patent: Feb. 17, 2004

(54) FLIP-CHIP BUMBING METHOD FOR FABRICATING SOLDER BUMPS ON SEMICONDUCTOR WAFER

(75) Inventors: Chih-Shun Chen, Taichung (TW);
Po-Hao Yuan, Taichung (TW);
Shih-Kuang Chiu, Taichung (TW);
Feng-Lung Chien, Taichung (TW);
Ke-Chuan Yang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 210 days.

(21) Appl. No.: 09/656,843

(22) Filed: Sep. 7, 2000

(51) Int. Cl.[7] .............................. C25D 5/02; C25D 7/12
(52) U.S. Cl. ...................... 205/123; 205/118; 205/176; 205/181; 205/182
(58) Field of Search .................. 205/118, 122, 205/123, 157, 176, 181, 182

(56) References Cited

U.S. PATENT DOCUMENTS

| | | | |
|---|---|---|---|
| 4,927,505 A | | 5/1990 | Sharma et al. |
| 5,137,845 A | | 8/1992 | Lochon et al. |
| 5,492,863 A | * | 2/1996 | Higgins, III ................ 430/318 |
| 5,736,456 A | | 4/1998 | Akram |
| 5,773,359 A | | 6/1998 | Mitchell et al. |
| 5,902,686 A | | 5/1999 | Mis |
| 5,903,058 A | * | 5/1999 | Akram ....................... 257/737 |
| 5,904,859 A | | 5/1999 | Degani |
| 6,015,652 A | | 1/2000 | Ahlquist et al. |
| 6,117,299 A | * | 9/2000 | Rinne et al. ................ 205/123 |
| 6,197,613 B1 | * | 3/2001 | Kung et al. ................. 438/106 |
| 6,306,751 B1 | * | 10/2001 | Patel et al. ............ 228/180.22 |

FOREIGN PATENT DOCUMENTS

JP   5-166815 A   *   7/1993

OTHER PUBLICATIONS

Yung, E.K; Tulik, I., Electroplated Solder Joints for Flip-Chip Applications, Sep. 1991, IEEE Transactions on Components, Hybrids, and Manufacturing Technology, vol. 14, No. 3, pp. 549–559.*

Salonen, J.; Salmi, J., A Flip Chip Process Based on Electroplated Solder Bumps, Jun. 1994, Physica Scripta, vol. T54, pp. 230–234.*

Lin, Kwang–Lung; Chang, Shiuh–Yuan, Approaching a Uniform Bump Height of the Electroplated Solder Bumps on a Silicon Wafer, IEEE Transactions on Components, Hybrids, and Manufacturing Technology, vol. 19, No. 4, Nov. 1996, pp. 747–751.*

* cited by examiner

Primary Examiner—Roy King
Assistant Examiner—William T. Leader
(74) Attorney, Agent, or Firm—Peter F. Corless; Steven M. Jensen; Edwards & Angell, LLP

(57) ABSTRACT

A flip-chip bumping method is proposed for the fabrication of solder bumps on a semiconductor wafer for flip-chip application. The proposed flip-chip bumping method is intended for use on a semiconductor wafer predefined with a plurality of chip regions which are delimited from each other by a predefined cutting line and each of which is formed with a plurality of aluminum or copper based bond pads, and is characterized in the provision of a plating bus over and along the cutting line and connected to each bond pad. By means of this plating bus, the required UBM (Under Bump Metallization) fabrication and solder-bump fabrication can be both carried out through plating. Since plating process is considerably lower in cost than sputtering process and etching process, the proposed flip-chip bumping method can be more cost-effective to implement than prior art.

17 Claims, 3 Drawing Sheets

FLIP-CHIP BUMBING METHOD FOR FABRICATING SOLDER BUMPS ON SEMICONDUCTOR WAFER

BACKGROUND OF THE INVENTION

1. Field of the Invention

This invention relates to semiconductor fabrication technology, and more particularly, to a flip-chip bumping method for fabricating solder bumps on a semiconductor wafer for flip-chip application.

2. Description of Related Art

The flip-chip technology is an advanced semiconductor fabrication technology that allows the overall package size to be made very compact. The flip-chip package configuration differs from conventional ones particularly in that the semiconductor chip is mounted in an upside-down manner on a substrate and electrically coupled to the same by means of solder bumps provided on the active surface of the semiconductor chip. Since no bonding wires are required, the overall size of the flip-chip package can be made very compact as compared to conventional types of package configurations.

The attachment of solder bumps to a flip chip requires the provision of the so-called UBM (Under Bump Metallization) pads on the active surface of the flip chip, which is wettable to the solder bumps so that the solder bumps can be securely attached to the flip chip.

A great variety of patented technologies have been proposed for the fabrication of UBM pads on a flip chip. A few of these patented technologies are listed in the following:

U.S. Pat. No. 5,904,859 entitled "FLIP CHIP METALLIZATION";

U.S. Pat. No. 5,902,686 entitled "METHODS FOR FORMING AN INTERMETALLIC REGION BETWEEN A SOLDER BUMP AND AN UNDER BUMP METALLURGY LAYER AND RELATED STRUCTURES";

U.S. Pat. No. 6,015,652 entitled "MANUFACTURE OF FLIP-CHIP DEVICE";

U.S. Pat. No. 5,137,845 entitled "METHOD OF FORMING METAL CONTACT PADS AND TERMINALS ON SEMICONDUCTOR CHIPS"

U.S. Pat. No. 5,773,359 entitled "INTERCONNECTION SYSTEM AND METHOD OF FABRICATION", U.S. Pat. No. 5,736,456 entitled "METHOD OF FORMING CONDUCTIVE BUMPS ON DIE FOR FLIP CHIP APPLICATIONS";

U.S. Pat. No. 4,927,505 entitled "METALLIZATION SCHEME PROVIDING ADHESION AND BARRIER PROPERTIES";

U.S. Pat. No. 5,903,058 entitled "CONDUCTIVE BUMPS ON DIE FOR FLIP CHIP APPLICATION".

In general, there are three different technologies for UBM fabrication: sputtering UBM technology, evaporation UBM technology, and electroless plating UBM technology. In terms of cost-effectiveness, the electroless plating UBM technology is mostly preferable to use since the required process steps are least complex.

One drawback to the use of the electroless plating UBM technology, however, is that the subsequent forming of solder bumps on the resulted UBM layers van be implemented only through printing technology, which is considerably complex in process steps and thus cost-ineffective to use. Moreover, the use of the electroless plating UBM technology would exclude the use of gold (Au), tin/lead (Sn/Pb), or copper (Cu), so that its utilization is limited.

SUMMARY OF THE INVENTION

It is therefore an objective of this invention to provide a flip-chip bumping method for fabricating solder bumps on a semiconductor wafer for flip-chip application, which allows the fabrication of UBM layers and the fabrication of solder bumps to be both implemented through plating.

It is another objective of this invention that the provided flip-chip bumping method can be more cost-effective to implement than prior art.

In accordance with the foregoing and other objectives, the invention proposes a flip-chip bumping method for fabricating solder bumps on a semiconductor wafer for flip-chip application.

The flip-chip bumping method of the invention is proposed for use on a semiconductor wafer predefined with a plurality of chip regions which are delimited from each other by a predefined cutting line and each of which is formed with a plurality of aluminum or copper based bond pads.

The flip-chip bumping method of the invention comprises the following steps: (1) forming a plating bus over and along the cutting line and connected to each bond pad; (2) performing a UBM fabrication process, wherein a first plating electrical current is applied through the plating bus to each bond pad for fabricating a UBM layer over each bond pad through plating; and (3) performing solder-bump fabrication through a plating process, wherein a second plating electrical current is applied through the plating bus to each bond pad for plating a selected solder material over the UBM layer on each bond pad to thereby form a solder bump over the UBM layer on each bond pad.

The flip-chip bumping method of invention is distinguishable from the prior art particularly in that it allows the UBM fabrication and the solder-bump fabrication to be both implemented through plating. Since plating is considerably lower in cost than sputtering and etching, the flip-chip bumping method of the invention can be more cost-effective to implement than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The flip-chip bumping method of the invention is disclosed in full details in the following with reference to the accompanying drawings.

Figure 1:
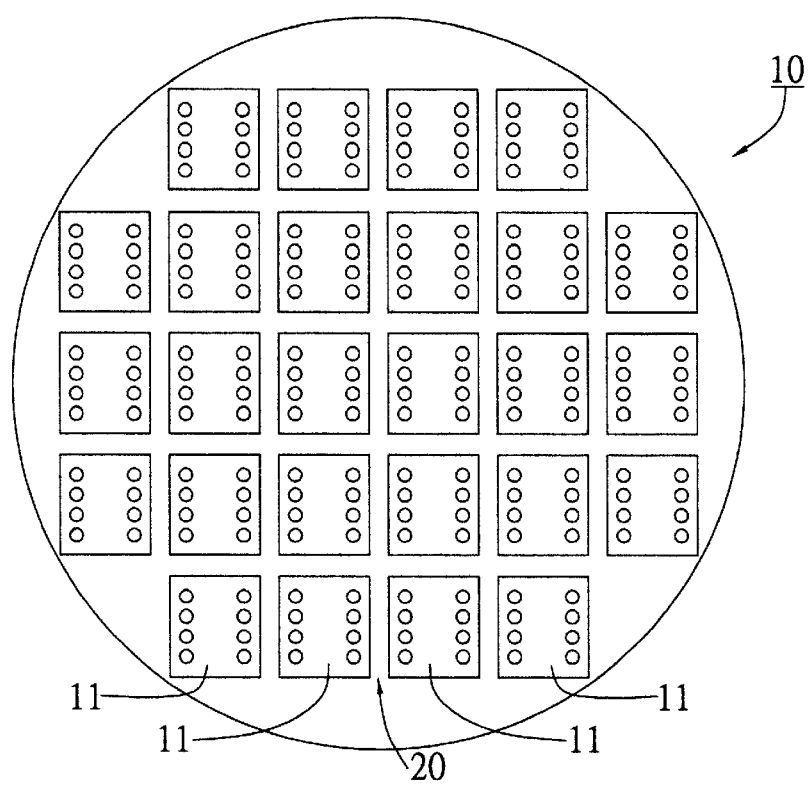
FIG. 1 shows a schematic top view of a semiconductor wafer used for flip chip application.

FIG. 1 is a schematic diagram showing a typical semiconductor wafer 10 which is predefined with a plurality of chip regions 11, each being used for the fabrication of a single integrated circuit chip. These integrated circuit chips 11 are delimited by a plurality of crosswise and lengthwise cutting lines 20 of a predefined width.

For flip chip application, each of the integrated circuit chips 11 is formed with a plurality of bond pads 30 which serve as external connecting points for the internal circuitry of each of the integrated circuit chips 11. These bond pads 30 are customarily fabricated from aluminum (Al) or copper (Cu).

Figure 2:
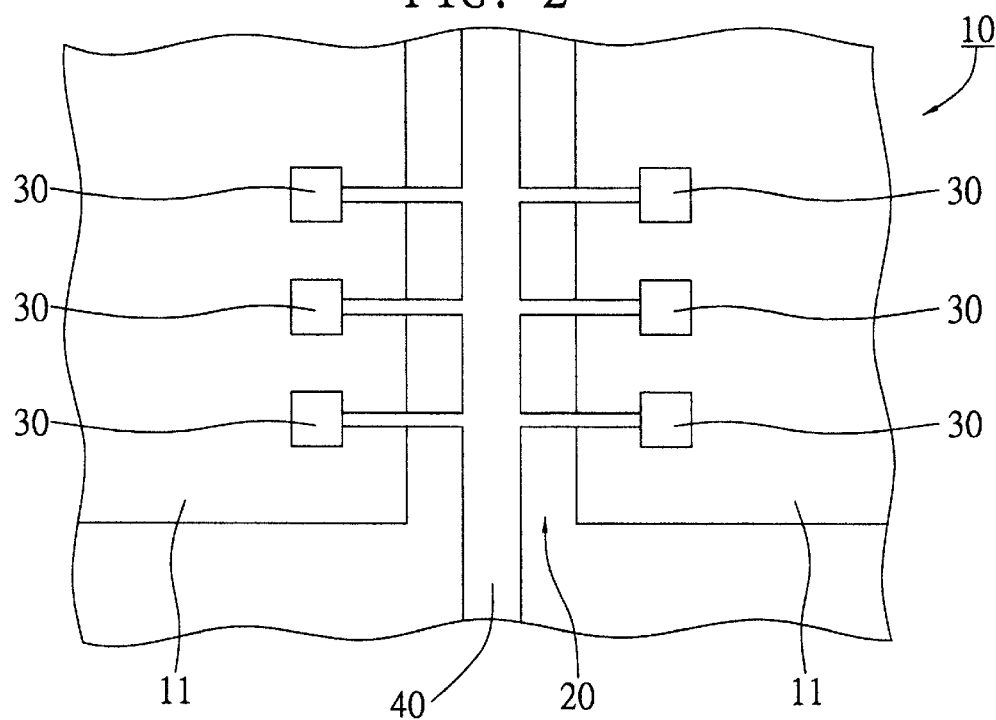
FIG. 2 shows an enlarged view of a selected part of the wafer of FIG. 1.

FIG. 2 shows an enlarged view of a selected part of the semiconductor wafer 10 of FIG. 1. It is a characteristic feature of the invention that a plating bus 40 is formed over and along the cutting lines 20 over the semiconductor wafer 10, and which is branched to each of the bond pads 30 within each of the integrated circuit chips 11. This plating bus 40 can be formed, for example, through a conventional masked metallization process in which an electrically-conductive material is deposited through mask definition over the cutting lines of the semiconductor wafer 10.

Figure 3A:
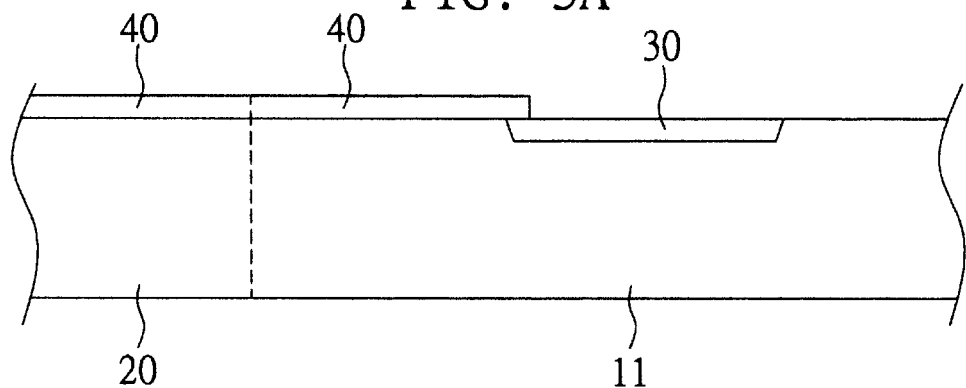
FIGS. 3A–3C are schematic sectional diagrams used to depict the UBM fabrication and solder-bump fabrication by the method of the invention.
Figure 3B:
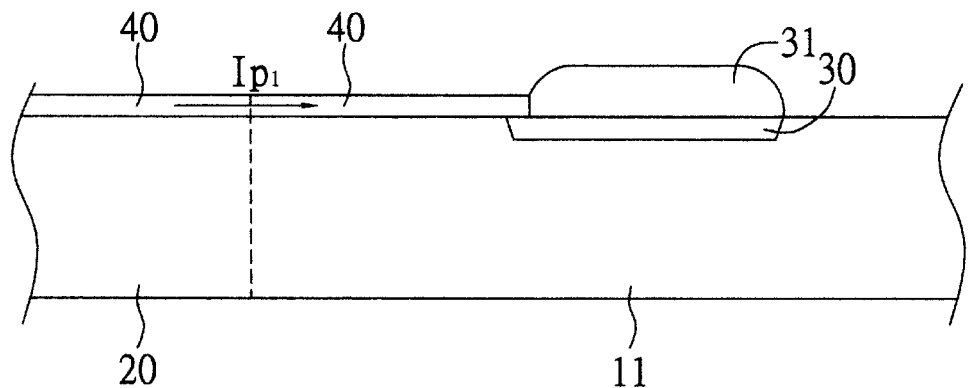
Figure 3C:
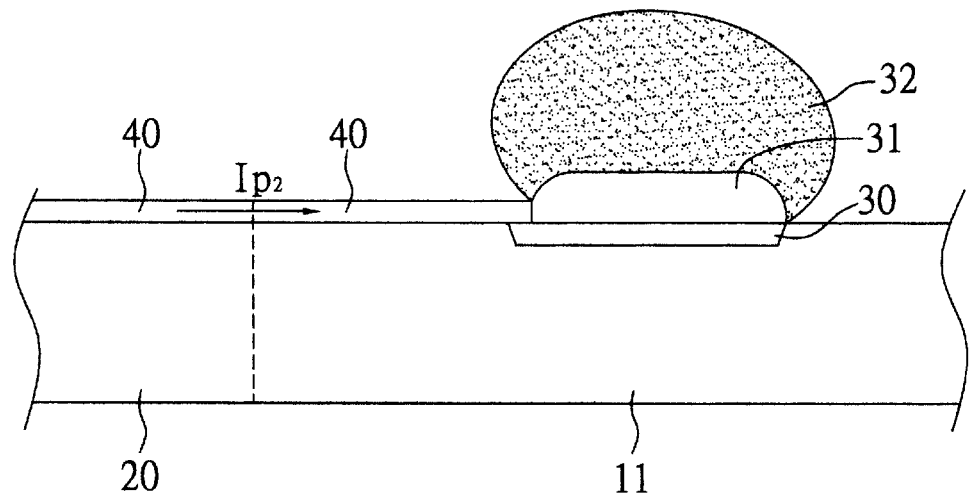

FIGS. 3A–3C are schematic sectional diagrams used to depict the UBM fabrication and solder-bump fabrication by the method of the invention (note that FIGS. 3A–3C are simplified to show only the components related to the invention; the actual wafer would include many various other semiconductor components).

FIG. 3A shows a sectional view of one bond pad 30 and the plating bus 40 shown in FIG. 2. The plating bus 40 is laid over the cutting line 20 and electrically connected to the bond pad 30.

Referring to FIG. 3B, by means of the plating bus 40, a UBM fabrication process is performed by applying a first plating electrical current $I_{P1}$, through the plating bus 40 to the bond pad 30 for the fabrication of a UBM layer 31 over the bond pad 30. The UBM layer 31 is typically a multi-layer metallization structure consisting of such metals as copper (Cu), nickel (Ni), and gold (Au). All of these metals can be plated over the bond pad 30 by means of the plating bus 40.

Referring further to FIG. 3C, in the next step, a solder-bump fabrication process is performed by applying a second plating electrical current $I_{P2}$ through the same plating bus 40 to the bond pad 30 for the plating of a selected solder material, such as tin/lead alloy (Sn/Pb), over the UBM layer 31. As a result of this process, a solder bump 32 is formed over the UBM layer 31.

As the fabrication of the semiconductor wafer 10 is completed, a sawing process is then performed by cutting along the cutting lines 20 shown in FIG. 1 so as to cut apart the integrated circuit chips 11 from each other.

Figure 4:
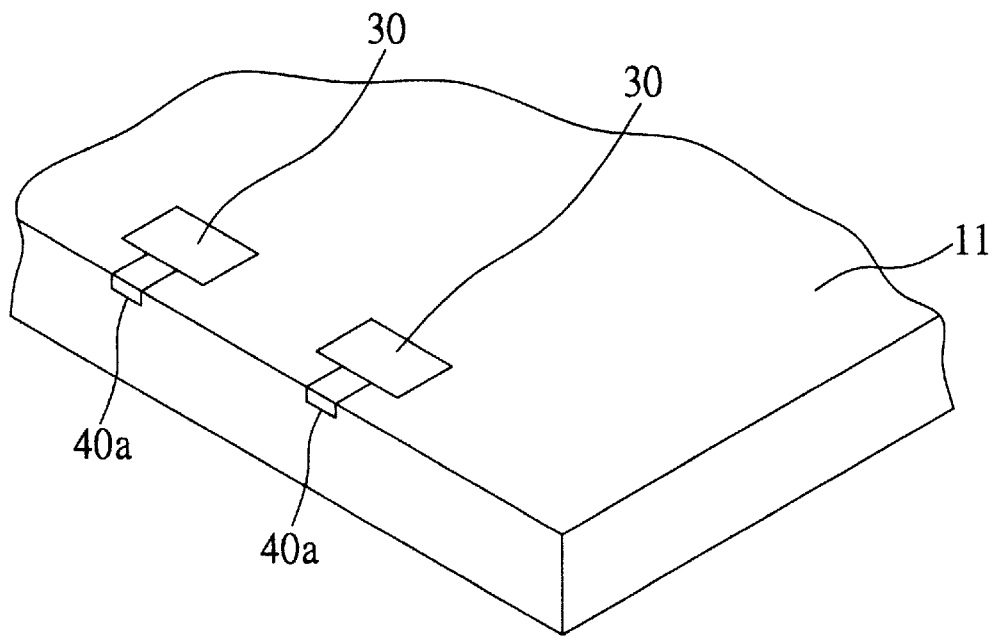
FIG. 4 is a schematic diagram showing remnant portions of a plating bus on a flip chip cut apart from the semiconductor wafer.

As shown in FIG. 4, as each individual integrated circuit chip 11 is cut apart from the wafer 10 of FIG. 1, however, a remnant portion of the original plating bus (here designated by the reference numeral 40a) will be undesirably left on the edge of the integrated circuit chip 11. This remnant portion of plating bus 40a, if not insulatively passivated, would easily cause short-circuits to the internal circuitry of the integrated circuit chips 11 or being eroded to cause damage to the bond pads 30. This problem, however, can be solved incidentally during subsequent packaging steps, as described below.

Figure 5A:
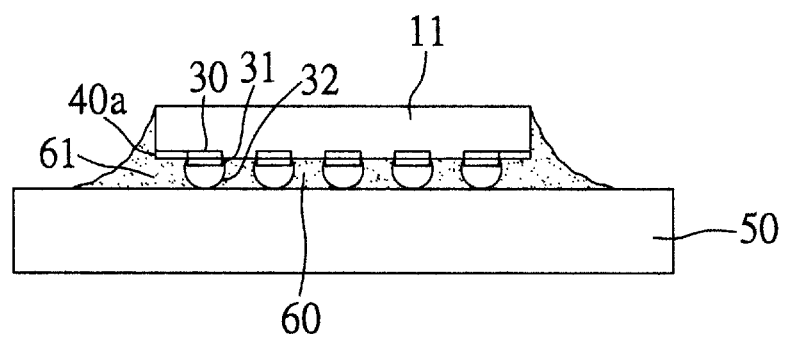
FIG. 5A is a schematic diagram used to depict how a flip-chip underfill process can help provide a passivation effect to the remnant portions of the plating bus shown in FIG. 4.

As shown in FIG. 5A, each individual integrated circuit chip 11 is then mounted in an upside-down (flip chip) manner over a substrate 50 by means of the solder bump 32. Next, a flip-chip underfill process is performed to fill an electrically-insulative material into the gap between the integrated circuit chip 11 and the substrate 50 to thereby form an underfill layer 60. The underfill layer 60 typically would include a fillet portion 61 beyond the edge of the integrated circuit chip 11. The flip-chip underfill process is a conventional and well-known technique, so detailed steps thereof will not be further described. As an incidental benefit, however, the remnant portion of plating bus 40a can be covered by the fillet portion 61 of the underfill layer 60, thereby being insulatively passivated from the ambient environment.

Figure 5B:
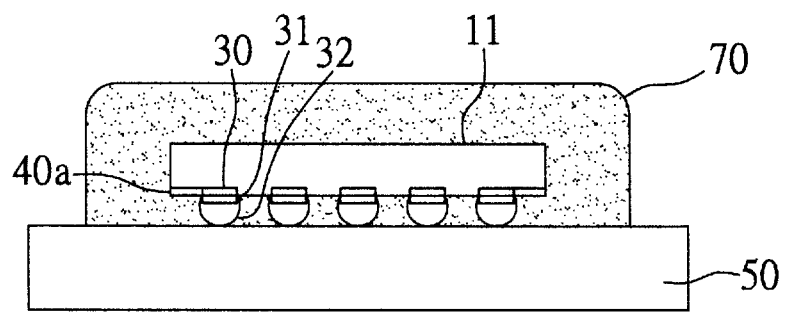
FIG. 5B is a schematic diagram used to depict how an encapsulation process can help provide a passivation effect to the remnant portions of the plating bus shown in FIG. 4.

As further shown in FIG. 5B, in addition, an encapsulation process can be performed to form a molding compound 70 to encapsulate the integrated circuit chip 11. As an incidental benefit, the remnant portion of plating bus 40a can be hermetically sealed in the molding compound 70, so that it can be insulatively passivated from the ambient environment. This allows the resulted flip-chip package to be assured in quality and reliability.

In conclusion, the invention provides a flip-chip bumping method which allows the UBM fabrication and the solder-bump fabrication to be both implemented through plating by means of a plating bus formed over the cutting lines on the semiconductor wafer. Since plating is considerably less complex in process steps than sputtering and etching, the invention is more cost-effective to implement than prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A flip-chip bumping method for use on a semiconductor wafer predefined with a plurality of integrated circuit chips which are delimited from each other by a predefined cutting line and each of which is formed with a plurality of bond pads, the flip-chip bumping method comprising the steps of:

(1) forming a plating bus having a main portion over and along the cutting line and a plurality of branches extending from the main portion, each of the branches being connected to one of the bond pads which are exposed to outside of the plating bus;

(2) performing a UBM fabrication process, wherein a first plating electrical current is applied through the plating bus to each bond pad for fabricating a UBM layer over each bond pad through plating; and (3) performing a solder-bump fabrication process, wherein a second plating electrical current is applied through the plating bus to each bond pad for plating of a selected solder material over the UBM layer on each bond pad to thereby form a solder bump over the UBM layer on each bond pad.

2. The flip-chip bumping method of claim 1, wherein the bond pads are aluminum-based bond pads.

3. The flip-chip bumping method of claim 1, wherein the bond pads are copper-based bond pads.

4. The flip-chip bumping method of claim 1, wherein in said step (2), the UBM fabrication process comprises the plating of copper (Cu) over the bond pad.

5. The flip-chip bumping method of claim 1, wherein in said step (2), the UBM fabrication process comprises the plating of nickel (Ni) over the bond pad.

6. The flip-chip bumping method of claim 1, wherein in said step (2), the UBM fabrication process comprises the plating of gold (Au) over the bond pad.

7. The flip-chip bumping method of claim 1, wherein in said step (3), the solder material is Sn/Pb.

8. A flip-chip bumping method for use on a semiconductor wafer predefined with a plurality of integrated circuit chips which are delimited from each other by a predefined cutting line and each of which is formed with a plurality of aluminum-based bond pads, the flip-chip bumping method comprising the steps of:

(1) forming a plating bus having a main portion over and along the cutting line and a plurality of branches extending from the main portion, each of the branches being connected to each one of the aluminum-based bond pads which are exposed to outside of the plating bus;

(2) performing a UBM fabrication process, wherein a first plating electrical current is applied through the plating bus to each aluminum-based bond pad for fabricating a UBM layer over each aluminum-based bond pad through plating; and (3) performing a solder-bump fabrication process, wherein a second plating electrical current is applied through the plating bus to each aluminum-based bond pad for plating of a selected solder material over the UBM layer on each aluminum-based bond pad to thereby form a solder bump over the UBM layer on each aluminum-based bond pad.

9. The flip-chip bumping method of claim 8, wherein in said step (2), the UBM fabrication process comprises the plating of copper (Cu) over the bond pad.

10. The flip-chip bumping method of claim 8, wherein in said step (2), the UBM fabrication process comprises the plating of nickel (Ni) over the bond pad.

11. The flip-chip bumping method of claim 8, wherein in said step (2), the UBM fabrication process comprises the plating of gold (Au) over the bond pad.

12. The flip-chip bumping method of claim 8, wherein in said step (3), the solder material is Sn/Pb.

13. A flip-chip bumping method for use on a semiconductor wafer predefined with a plurality of integrated circuit chips which are delimited from each other by a predefined cutting line and each of which is formed with a plurality of copper-based bond pads, the flip-chip bumping method comprising the steps of:

(1) forming a plating bus having a main portion over and along the cutting line and a plurality of branches extending from the main portion, each of the branches being connected to each one of the copper-based bond pads which are exposed to outside of the plating bus;

(2) performing a UBM fabrication process, wherein a first plating electrical current is applied through the plating bus to each copper-based bond pad for fabricating a UBM layer over each copper-based bond pad through plating; and (3) performing a solder-bump fabrication process, wherein a second plating electrical current is applied through the plating bus to each copper-based bond pad for plating of a selected solder material over the UBM layer on each copper-based bond pad to thereby form a solder bump over the UBM layer on each copper-based bond pad.

14. The flip-chip bumping method of claim 13, wherein in said step (2), the UBM fabrication process comprises the plating of copper (Cu) over the bond pad.

15. The flip-chip bumping method of claim 13, wherein in said step (2), the UBM fabrication process comprises the plating of nickel (Ni) over the bond pad.

16. The flip-chip bumping method of claim 13, wherein in said step (2), the UBM fabrication process comprises the plating of gold (Au) over the bond pad.

17. The flip-chip bumping method of claim 13, wherein in said step (3), the solder material is Sn/Pb.

* * * * *